(12) United States Patent
Shin

(10) Patent No.: US 7,046,575 B2
(45) Date of Patent: May 16, 2006

(54) BUS CONNECTION CIRCUIT FOR READ OPERATION OF MULTI-PORT MEMORY DEVICE

(75) Inventor: Beom-Ju Shin, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 52 days.

(21) Appl. No.: 10/876,504

(22) Filed: Jun. 24, 2004

(65) Prior Publication Data
US 2005/0249019 A1    Nov. 10, 2005

(30) Foreign Application Priority Data
May 6, 2004    (KR)    .................... 10-2004-0031988

(51) Int. Cl.
*G11C 8/00*    (2006.01)

(52) U.S. Cl. .................................. 365/230.05; 365/191
(58) Field of Classification Search ........... 365/230.05, 365/191
See application file for complete search history.

(56) References Cited

U.S. PATENT DOCUMENTS

| | | | | |
|---|---|---|---|---|
| 5,835,436 A | * | 11/1998 | Ooishi | 365/230.03 |
| 5,991,223 A | * | 11/1999 | Kozaru et al. | 365/230.03 |
| 6,104,653 A | * | 8/2000 | Proebsting | 365/203 |
| 6,163,475 A | * | 12/2000 | Proebsting | 365/63 |
| 6,185,256 B1 | * | 2/2001 | Saito et al. | 375/257 |

\* cited by examiner

*Primary Examiner*—Michael Tran
(74) *Attorney, Agent, or Firm*—Blakely Sokoloff Taylor & Zafman

(57) ABSTRACT

There is provided a semiconductor memory design technique, specifically a bus connection circuit for a read operation of a multi-port memory device. The bus connection circuit is adapted to a current sensing type bus transmission/reception structure. The bus connection circuit includes: a read data sensing/latching unit for sensing/latching a read data applied on a local data bus in response to a read data strobe signal; and a read data driving unit for driving the data latched in the read data sensing/latching unit to a global data bus in response to a read data driving pulse, and for connecting or disconnecting a path of current flowing the global data bus according to a logic level of the latched data.

15 Claims, 10 Drawing Sheets

BUS CONNECTION CIRCUIT FOR READ OPERATION OF MULTI-PORT MEMORY DEVICE

FIELD OF THE INVENTION

The present invention relates to a semiconductor memory design technology; and, more particularly, to a bus connection circuit for a read operation of a multi-port memory device.

DESCRIPTION OF RELATED ART

Most of memory devices, including a random access memory (RAM), have one port. Also, one port has a plurality of input/output pin sets. In other words, the memory device has only one port for data exchange with chipset. However, in recent years, a function separation between the memory device and the chipset has been ambiguous and an integration of the chipset and the memory device has been considered. This tendency demands a multi-port memory device that can directly exchange data with peripheral graphic devices, CPU, and so on. In order to implement such a multi-port memory device, any one of a plurality of ports must be able to provide an access to all memory cells.

FIG. 1 is a block diagram illustrating an architecture of a 256M multi-port DRAM, which is disclosed in Korean Patent Application No. 2003-92375, filed by the same applicant on Dec. 17, 2003.

Referring to FIG. 1, the 256M multi-port DRAM includes a plurality of memory cells and a plurality of row decoders RDEC. The 256M multi-port DRAM includes a plurality of banks bank0 to bank15, a control block 100, a plurality of ports port0 to port7, first to fourth global data buses GIO_UL, GIO_UR, GIO_DL and GIO_DR, first and second global data bus connection blocks, a plurality of transfer buses TB, a plurality of transfer bus connection blocks TG, a plurality of bus connection blocks TL, and a plurality of data transfer blocks QTRX.

The plurality of banks bank0 to bank15 are arranged in a row direction (a right and left direction in the drawing) as many as a predetermined number at four divided sections (quadrants) of a core area.

The control block 100 is arranged between the first/third quadrants and the second/fourth quadrants to divide the core area into two sections. The control block 100 generates an internal command signal, an internal address signal and a control signal using an inputted command, addresses, and so on, and controls respective elements of the memory device.

The plurality of ports port0 to port7 are arranged at edge portions of the respective quadrants and perform an independent communication with different target devices.

The first to fourth global data buses GIO_UL, GIO_UR, GIO_DL and GIO_DR are arranged between each bank and each port corresponding to the respective quadrants in a row direction and perform a parallel data transmission.

The first and second global data bus connection blocks PR_U and PR_D are arranged between two global data buses, which are adjacent to each other in a row direction, and selectively connect the two global data buses.

The plurality of transfer buses TB are arranged in a column direction (an up and down direction in the drawing) of each bank and perform a data transmission inside the banks The plurality of transfer bus connection blocks TG arranged between two banks, which are adjacent to each other in a column direction, and selectively connect the two transfer buses TB.

The plurality of bus connection blocks TL are arranged between each bank and each global data bus of the quadrant in which each bank is contained, and perform a data exchange between the corresponding transfer bus TB and the corresponding global data bus.

The plurality of data transfer blocks QTRX are arranged between each port and each global data bus of the quadrant in which each port is contained, and perform a data transmission/reception between the corresponding port and the corresponding global data bus.

A detailed structure of the 256M multi-port DRAM will now be described.

Each of the sixteen banks bank0 to bank15 includes 16M DRAM cells (8 k(row)×2 k(column)) and the row decoder RDEC. Each bank includes a core circuit, such as a bit line sense amplifier and an equalizer, which is necessary in a typical DRAM core. The banks bank0 to bank15 are arranged at the four quadrants, each of which includes four banks in a row direction. In detail, the banks bank0, bank2, bank4 and bank6 are arranged at the first quadrant (a left and up section) of the core area, and the banks bank8, bank10, bank12 and bank14 are arranged at the second quadrant (a right and up section). Also, the banks bank1, bank3, bank5 and bank7 are arranged at the third quadrant (a left and down section), and the banks bank9, bank11, bank 13 and bank15 are arranged at the fourth quadrant (a right and down section). Meanwhile, it is preferable that each row decoder RDEC is arranged to pair a row decoder RDEC of an adjacent bank at one side of each bank. One page (column) is divided into four segments, each of which consists of 512 cells.

The control block 100 generates internal command signals, internal address signals, and control signals using the command and addresses, which are transmitted in a packet form, and controls the respective elements of the memory device. Here, the internal command signals include an internal activation command signal (ACT), an internal inactivation command signal (PCG), an internal read command signal (RD), an internal write command signal (WD), and so on. The internal address signals include an activation array address (AAA), an inactivation array address (PAA), a read array address (RAA), a write array address (WAA), a row address (RA), a read segment address (RSA), a write segment address (WSA), and so on. The control signals include a transfer gate control signal (TGC), a pipe register flag signal (PRFG), a pipe register data driving signal (DP), a DRAM core test mode flag signal (DTM), and so on.

The ports port0 to port7 are arranged at die edge portions of the respective quadrants, each of which includes two ports. The die edge portion means a major axis portion shared by all banks of the corresponding quadrant. In detail, the ports port0 and port2 are arranged at the first quadrant, and the ports port4 and port6 are arranged at the second quadrant. The ports port1 and port3 are arranged at the third quadrant, and the ports prot5 and port7 are arranged at the fourth quadrant. Each port supports a serial I/O interface and performs an independent communication with different target devices (for example, chipset, graphic chip, etc.). Meanwhile, in case where the ports port0 to port7 are configured to support the serial I/O interface, each of the ports port0 to port7 includes a plurality of pads corresponding to data, addresses and commands, a pad buffer (a read buffer, a write buffer) for buffering transmission/reception signals transferred to the pad, a decoder for decoding the received data, an encoder for encoding the data to be transmitted, and a data converter for converting a received serial data into a parallel data and converting a parallel data to be transmitted into a serial data.

The first global data bus GIO_UL is arranged between the banks and the ports of the first quadrant, and the second global data bus GIO_UR is arranged at the second quadrant. The third global data bus GIO_DL is arranged at the third quadrant, and the fourth global data bus GIO_DR is arranged at the fourth quadrant. The first to fourth global data buses GIO_UL, GIO_UR, GIO_DL and GIO_DR are bi-directional data buses (512 bits), which are connected to the banks, ports and global data bus connection blocks PR_U and PR_D of the corresponding quadrants, respectively.

Meanwhile, the first and second global data buses GIO_UL and GIO_UR can be connected to each other through the first global data bus connection block PR_U, and the third and fourth global data buses GIO_DL and GIO_DR can be connected to each other through the second global data bus connection block PR_D. The first and second global data bus connection blocks PR_U and PR_D include bi-directional pipe registers corresponding to the number (512) of the lines of the global data buses.

Also, the transfer buffers TB are local data buses for connecting the bit line sense amplifiers and the bus connection blocks TL of the corresponding banks. The number of the lines of the transfer buses TB is identical to the number (for example, 512) of the cells corresponding to one segment and the transfer buses TB are configured with differential buses.

The transfer bus connection blocks TG can be configured with MOS transistors, the number of which is identical to the number of the lines of the transfer buses TB. Because the transfer buses TB are the differential buses, one transfer bus connection block TG can be configured with 512 pairs of MOS transistors. For this reason, the transfer bus connection block TG is called a transfer gate.

Also, the bus connection block TL includes a total of sixteen sets, each of which is 512 transfer latches. Each of the transfer latches is provided with a read bus connection circuit (an I/O sense amplifier of DRAM) and a write bus connection circuit (a write driver of DRAM). Here, the read bus connection circuit includes a read sense amplifier for sensing and latching a read data, which is applied on the transfer bus TB, and a read driver for driving the latched data to the global data bus of the quadrant to which the corresponding bank belongs. The write bus connection circuit includes a write latch for sensing and latching a write data, which is applied on the global data bus, and a write driver for driving the write data to the transfer bus TB.

The data transfer block TR includes 512 transmitters (Tx) for transmitting write data applied on a corresponding port to the global data bus, and 512 receivers (Rx) for receiving read data applied from the global data bus and transmitting the read data to a corresponding port.

Although not shown in the drawing, the 256M multi-port DRAM further includes a voltage generator, a test logic, and a variety of pads. The voltage generator is arranged at each edge portion of the die and is configured to receive an external voltage to generate an internal voltage. The test logic is arranged between the ports corresponding to the first and second quadrants and between the ports corresponding to the third and fourth quadrants. The pads include a clock pad arranged at the edge portion of the die.

Command lines (ACT, PCG, RD, WD) and address lines (AAA<0:1>, PAA<0:1>, RAA<0:1>, RA<0:12>, RSA<0:1>), which extend from the control block 100 to the corresponding banks, are provided at the respective quadrants. Transfer gate control lines (TGC<0:3>) extending from the control block 100 to the transfer bus connection block TG are provided at the right and left sides of the control block 100.

FIG. 2 is a block diagram illustrating the segment and the transfer bus TB in the 256M multi-port DRAM of FIG. 1.

Referring to FIG. 2, like a general DRAM, the 256M multi-port DRAM includes a plurality of memory cell arrays 200 and a plurality of bit line sense amplifier arrays 210. In view of one memory cell array 200, a pair of transfer buses TB<0> and TBb<0> are connected to four bit line sense amplifiers BLSA that are arranged at upper and lower portions of the memory cell array 200 (refer to a box A). The four bit line sense amplifiers BLSA are controlled by different segment selection signals SGS<0:3>. The segment selection signal is a signal corresponding to a column selection signal (Yi) of the general DRAM. In case of 2 k columns, if one row and one segment are selected, 512 cells are selected at the same time, such that data exchange with the corresponding 512-bit transfer buses TB<0:511> is achieved.

Meanwhile, the transfer buses TB corresponding to each bank of the first quadrant can be connected through the transfer gates TG to the transfer buses TB corresponding to each bank of the third quadrant, which is arranged on the same column axis (512 transfer gates TG are configured as one set and a total of 8 sets are provided). In other words, the transfer gates TG are arranged between the transfer buses TB corresponding to two banks (which is defined as an array) arranged on the same column axis and selectively connects two transfer buses TB. A control signal TGC for controlling the transfer gates TG is generated from the control block 100.

An operation of the 256M multi-port DRAM will now be described.

FIGS. 3A and 3B illustrate a normal read path and a normal write path of the 256M multi-port DRAM shown in FIG. 2, respectively.

First, an operation of reading out 512-bit data from a specific segment of the bank bank0 through the port port0 will be described.

Referring to FIG. 3A, if command and address related to a read operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal read command signal (RD), a read array address (RAA) and a read segment address (RSA) for the bank bank0. The bit line sense amplifier BLSA senses and amplifies 512-bit data of a segment corresponding to the read segment address (RSA), thus driving the transfer buses TB and TBb. Meanwhile, the bus connection block TL of the bank bank0 senses a read data applied on the transfer buses TB and TBb of the bank bank0 and drives data to the first global data bus GIO_UL. Then, the read data transferred to the first global data bus GIO_UL is stored in the read buffer of the port port0 through the receiver (Rx) of the data transfer block QTRX corresponding to the port port0. The data stored in the read buffer is converted into a packet of predetermined unit and transmitted to the target device connected to the port port0 in a serial data form. Then, the control block 100 generates an internal inactivation command signal (PCG) and an inactivation array address (PAA) to inactivate the row of the corresponding array. At this time, the transfer bus connection block TG of the corresponding array becomes a switched-off state, such that the transfer buses TB and TBb of the bank bank0 are disconnected from the transfer buses TB and TBb of the bank bank1 arranged within the same array. Reference numerals "BL" and "BLb" represent bit line pair, a reference numeral "T" represents a cell transistor, and a reference numeral "C" represents a cell capacitor.

Next, an operation of writing 512-bit data to a specific segment of the bank bank0 through the port port0 will be described.

Referring to FIG. 3B, if command, address and data related to a write operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal write command signal (WT), a write array address (WAA) and a write segment address (WSA) for the bank bank0. At this time, 512-bit data stored in a write buffer of the port port0 are written to a segment (512 memory cells) corresponding to the write segment address (WSA) by a scheduling. The data converted into the parallel data at the port port0 are loaded on the first global data bus GIO_UL through the transmitter (Tx) of the data transfer block TR and are driven to the transfer buses TB and TBb of the bank bank0 through the bus connection block TL of the bank bank0. The data loaded on the transfer buses TB and TBb of the bank bank0 are stored in 512 memory cells through the bit line sense amplifiers BLSA corresponding to the write segment address (WSA). Then, the control block 100 generates an internal inactivation command signal (PCG) and an inactivation array address (PAA) to inactivate the row of the corresponding array.

FIGS. 4A and 4B illustrate a cross read path and a cross write path of the 256M multi-port DRAM of FIG. 2, respectively.

First, an operation of reading out 512-bit data from a specific segment of the bank bank0 through the port port1 will be described.

Referring to FIG. 4A, an overall operation is almost similar to the above-described normal read operation. A difference is that the transfer bus connection block TG of the corresponding array is in a switched-on state such that the transfer buses TB and TBb of the bank bank0 are connected to the transfer buses TB and TBb of the bank bank1 within the same array.

Meanwhile, the data loaded on the transfer buses TB and TBb of the bank bank1 are transferred to the target device through the bus transfer block TL of the bank bank1, the third global data bus GIO_DL, the data transfer block TR of the port port1, and the port port1 in sequence.

Next, an operation of writing 512-bit data to a specific segment of the bank bank0 through the port port1 will be described.

Referring to FIG. 4B, an overall operation is almost similar to the above-described normal write operation. A difference is that the transfer bus connection block TG of the corresponding array is in a switched-on state such that the transfer buses TB and TBb of the bank bank0 are connected to the transfer buses TB and TBb of the bank bank1 within the same array. In this case, the data applied on the port port1 are loaded on the transfer buses TB and TBb of the bank bank0 through the bus transfer block TR of the port port1, the third global data bus GIO_DL, and the bus connection block TL of the bank bank1 in sequence. Following procedures are identical to the above-described normal write operation.

Meanwhile, in case where data exchange between the first global data bus GIO_UL and the second global data bus GIO_UR is required, the two global data buses are connected through the first global data bus connection block PR_U. In case where data exchange between the third data global data bus GIO_DL and the fourth global data bus GIO_DR is required, the two global data bus lines are connected through the second global data bus connection block PR_D.

Since the proposed 256M multi-port DRAM can access all segments at all ports port0 to port7 and also provide an independent access through a plurality of ports, a multi access is possible within a range in which the global data buses are not used overlappingly. Also, since the 256M multi-port DRAM can process 512-bit data in parallel at the respective quadrants of the core area through an application of the new architecture and can input/output data in serial at the ports. Accordingly, an increase of a layout area is minimized, a packaging is simplified, and a bandwidth is greatly increased without causing a skew between data lines at the data buses.

Meanwhile, the proposed multi-port DRAM includes 512-bit global data buses. The number of bus lines increases compared with an existing DRAM (DDR2) having 64 global data bus lines.

In case where the number of the global data bus lines is less than 64, power consumption does not matter even when data transmitted through the buses fully swings to a core voltage Vcc. However, in case where the number of the global data bus lines is more than 64, for example, 128, 256 or 512, a large amount of current is consumed during data transmission, thus causing a problem of power consumption.

In order to solve the problem of the power consumption at the wide global data buses, a global data bus transmission/reception structure is disclosed in Korean Patent Application No. 2003-94697, which is filed by the same applicant on Dec. 22, 2003. The proposed global data bus transmission/reception structure uses a current sensing method, instead of a voltage driving method.

FIG. 5 is a circuit diagram of a transmitter and a receiver, which are disclosed in Korean Patent Applicant No. 2003-94697.

Referring to FIG. 5, the transmitter 500 is connected between a ground voltage terminal Vss and a global data bus GIO and includes a pull-down NMOS transistor MN1 having a gate receiving data signal cdio.

Meanwhile, the receiver includes a reception part 510 for sensing a current flowing through the global data bus GIO and detecting data applied on the global data bus GIO, and a latch part 520 for latching data received by the reception part 510.

The reception part 510 includes a current mirror circuit 512 for mirroring a current flowing through the global data bus GIO to an output node A, a load 514 for determining an amount of current flowing the global data bus GIO, and a switching circuit 516 for forming a current path of the output node A in response to a data capture signal cp.

The latch part 520 includes an inverter circuit 522 for inverting a signal applied on the output node A of the reception part 510 in response to data capture signals cp and cpb, and a latch circuit 524 for inverting and latching an output of the inverter circuit 522.

The current mirror circuit 512 of the reception part 510 includes a PMOS transistor MP1 having a source connected to a power supply terminal vt1, and a drain and a gate diode-connected and a PMOS transistor MP2 having a source connected to a power supply terminal vt1 and a drain connected to the output node A.

The load 514 of the reception part 510 includes: an NMOS transistor MN2 having a source connected to the drain of the PMOS transistor MP1, a drain connected to the global data bus GIO, and a gate receiving a reference voltage vrtb; and an NMOS transistor MN3 having a source connected to the drain (the output node A) of the PMOS transistor MP2 and a gate receiving the reference voltage vrtb. In other words, the load 514 may be implemented with an active resistor. The reference voltage vrtb is a constant voltage which always maintains a constant level. A level of the reference voltage is determined in a range at which a minimum current is consumed, considering a length of bus, an operating frequency, and so on.

The switching circuit 516 of the reception part 510 includes an NMOS transistor MN4 having a source connected to the drain of the NMOS transistor MN3, a drain connected to a ground voltage terminal Vss, and a gate receiving the data capture signal cp.

Meanwhile, the inverter circuit 522 of the latch part 520 includes: a PMOS transistor MP3 having a source connected to the internal voltage terminal vt1 and a gate receiving the inverted data capture signal cpb; a PMOS transistor MP4 having a source connected to the drain of the PMOS transistor MP3, a drain connected to an output node B, and a gate receiving an output of the reception part 510; an NMOS transistor MN5 having a source connected to a ground voltage terminal Vss and a gate receiving the data capture signal cp; and an NMOS transistor MN6 having a source connected to the drain of the NMOS transistor MN5, a drain connected to the output node B, and a gate receiving the output of the reception part 510.

The latch circuit 524 of the latch part 520 may be implemented with two inverters INV1 and INV2.

FIG. 6 illustrates a simulation result of the circuit shown in FIG. 5.

The data capture signal cp is a high active pulse that is activated during a predetermined time (for example, 1 tCK) when a write command or read command is applied.

An operation of the circuit shown in FIG. 5 will now be described with reference to FIG. 6.

First, when the data signal cdio becomes a logic high level, the NMOS transistor MN1 of the reception part 510 is turned on, so that a current flows through the global data bus GIO. In other words, a current path is formed by the power supply terminal vt1, the PMOS transistor MP1, the NMOS transistor MN2, the global data bus GIO, the NMOS transistor MN1 and the ground voltage terminal Vss. Therefore, voltage levels of the global data bus GIO and the drain of the PMOS transistor MP1 of the current mirror circuit 512 are dropped below a threshold voltage of the PMOS transistor (Vt1-Vtp). The two PMOS transistors MP1 and MP2 of the current mirror circuit 212 are turned on, resulting in an increase of a voltage level at the output node A of the reception part 510.

At this point, if the data capture signal cp is activated to a logic high level, the NMOS transistors MN5 and MN6 of the inverter circuit 522 of the latch part 520 are turned on. Since the output of the reception part 510 is at a logic high level, the output node B of the inverter circuit 522 becomes a logic low level. Also, the latch circuit 524 outputs a logic high level and maintains the logic high level until the data capture signal cp is again activated.

Next, if the data signal cdio becomes a logic low level, the NMOS transistor MN1 of the transmitter 500 is turned on. Therefore, voltage levels of the global data bus GIO and the drain of the PMOS transistor MP1 of the current mirror circuit 512 are increased and the two PMOS transistors MP1 and MP2 of the current mirror circuit 512 are turned off.

At this point, the data capture signal cp is activated to a logic high level and the NMOS transistor MN4 is turned on. Thus, voltage level of the output node A of the reception part 510 is decreased. Also, if the data capture signal cp is activated to a logic high level, the PMOS transistors MP3 and MP4 of the inverter circuit 522 are turned on, so that the output of the reception part 510 is inverted so that the output node B of the inverter circuit 522 becomes a logic high level. Further, the latch circuit 524 outputs a logic low level and maintains the logic low level until the data capture signal cp is again activated.

The internal voltage vt1 used in the above-described receiver has about 1.8 V, which is somewhat lower than the core voltage Vcc (2.5 V). Therefore, in case where the data signal cdio is a logic high level, a voltage level of the global data bus GIO is somewhat higher than 0 V. In case where the data signal cdio is a logic low level, the global data bus GIO has a level less than 1 V, considering a threshold voltage of the MOS transistor. According to the present invention, the global data bus GIO does not fully swing to the core voltage Vcc and a swing width is very small. Therefore, it is possible to minimize the current that is consumed in a charge/discharge of the global data bus GIO. In this manner, the problem of the power consumption occurring when the number of global data bus lines is increased to 128, 256 or 512 can be solved by greatly reducing the current consumption.

Meanwhile, even when only a pull-up driver is used instead of the pull-down driver and the reception part 510 is modified, the current consumption can be reduced. However, in case where the pull-up driver is used, a driver transistor having twice or more size as large as the pull-down driver is needed in order to drive the global data bus GIO. For this reason, the pull-up driver is not suitable in view of an area of the semiconductor memory chip.

Meanwhile, the 256M multi-port DRAM shown in FIG. 1 includes two structures, each of which performs a transmission/reception with the global data bus GIO. In other words, one is a plurality of bus connection blocks TL, which are disposed between each bank and the global data bus of the quadrant containing the bank and perform data exchange between each transfer bus TB and the corresponding global data bus. The other is a plurality of data transfer blocks TR, which are disposed between each port and the global data bus of the quadrant containing the port and perform data transmission/reception between the corresponding port and the global data bus.

Although the reception structure 510 and 520 of FIG. 5 can be applied to both the receivers of the bus connection unit (transfer latch, TL) and the data transfer block TR, the transmitter 500 cannot be applied to the bus connection unit (transfer latch, TL) as it is.

Accordingly, there is a demand for an inventive bus connection circuit (IO sense amplifier in the general DRAM) adapted to a read operation of a current sensing type transmission/reception structure that transfers data from the transfer bus TB to the global data bus GIO.

SUMMARY OF THE INVENTION

It is, therefore, an object of the present invention to provide a read bus connection circuit of a multi-port memory device, which is adapted to a current sensing type bus transmission/reception structure.

In an aspect of the present invention, there is provided a bus connection circuit for a read operation of a multi-port memory device, which includes: a read data sensing/latching means for sensing/latching a read data applied on a local data bus in response to a read data strobe signal; and a read data driving means for driving the data latched in the read data sensing/latching means to a global data bus in response to a read data driving pulse, and for connecting or disconnecting a path of current flowing the global data bus according to a logic level of the latched data.

Preferably, the read data sensing/latching means includes: a differential-input flip-flop for sensing/latching the read data applied on the local data bus in response to the read data strobe signal; a transfer inverter configured to receive differential output signals of the differential-input flip-flop; and an inverter latch for latching an output of the transfer inverter.

Preferably, the read data driving means includes: a first NMOS transistor which is connected to a ground voltage terminal and has a gate receiving the read data driving pulse; and a second NMOS transistor which is connected between the first NMOS transistor and the global data bus and has a gate receiving an output of the read data sensing/latching means.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 7:
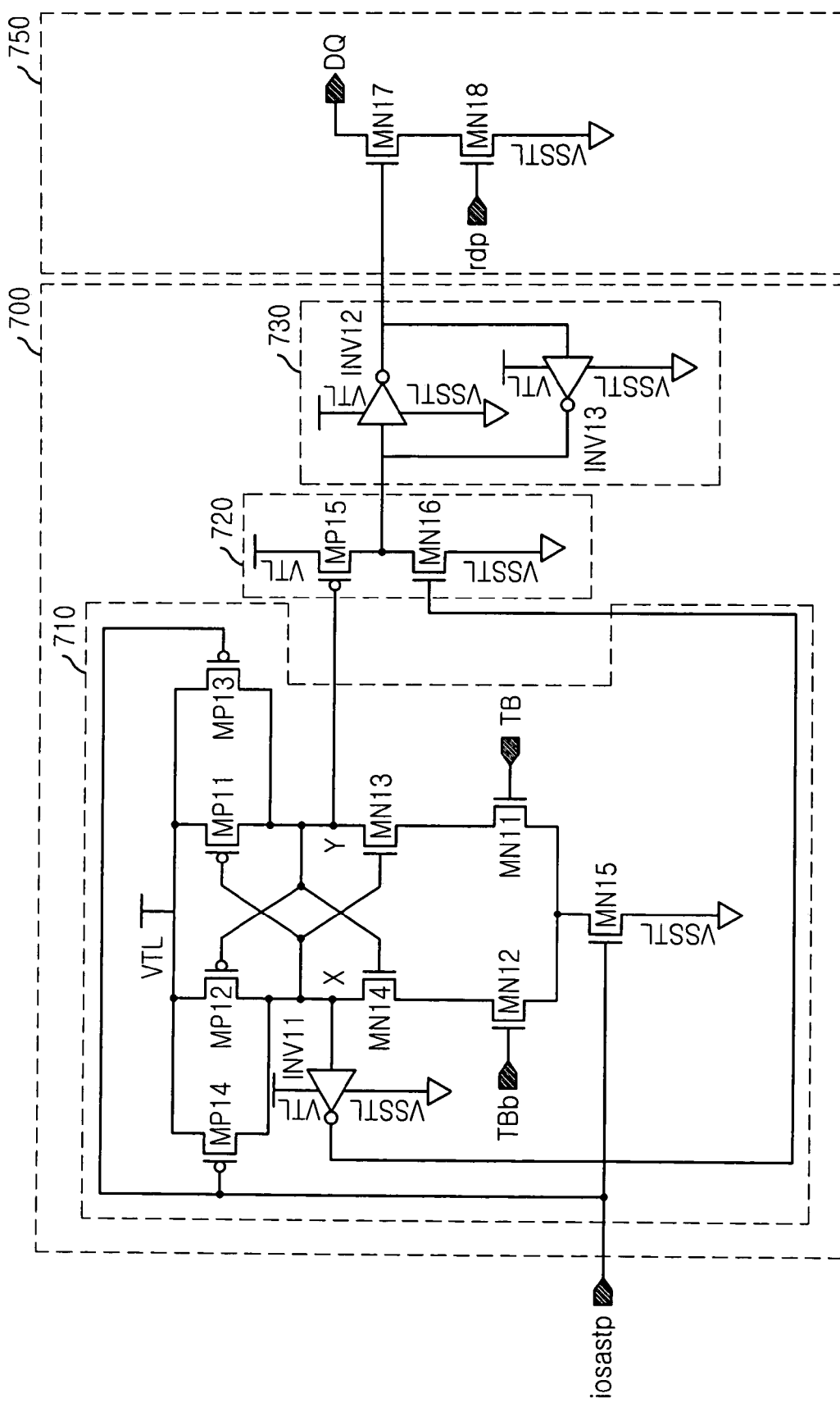
FIG. 7 illustrates a bus connection circuit for a read operation of a multi-port DRAM in accordance with an embodiment of the present invention.

FIG. 7 is a circuit diagram of a bus connection circuit for a read operation of a multi-port DRAM in accordance with an embodiment of the present invention.

Referring to FIG. 7, a bus connection circuit for a read operation of a multi-port DRAM in accordance with an embodiment of the present invention includes a read data sensing/latching block 700 and a read data driving block 750. The read data sensing/latching block 700 senses/latches read data of transfer buses TB and TBb in response to a read data strobe signal iosastp. The read data driving block 750 drives data latched by the read data sensing/latching block 700 to a global data bus in response to a read data driving pulse rdp. Also, the read data driving block 750 connects or disconnects a path of current flowing the global data bus according to a logic level of the latched data.

Here, the read data sensing/latching block 700 includes a differential-input flip-flop 710 for sensing/latching read data of the transfer buses TB and TBb in response to the read data strobe signal iosastp, a transfer inverter 720 configured to receive differential output signals of the differential-input flip-flop 710, and a latch 730 for latching an output of the transfer inverter 720.

Also, the differential-input flip-flop 710 includes: a sink NMOS transistor MN15 which is connected to a ground voltage terminal VSSTL and has a gate receiving the read data strobe signal iosastp; differential-input NMOS transistors MN11 and MN12 which are commonly connected to one terminal of the sink NMOS transistor MN15 and have gates receiving signals TB and TBb applied on the transfer buses, respectively; NMOS transistors MN13 and MN14 and PMOS transistors MP11 and MP12, which are cross-connected to non-inverting/inverting output terminals X and Y, thereby configuring an inverter latch; PMOS transistors MP13 and MP14 for precharging the non-inverting/inverting output terminals X and Y during an inactivation section of the read data strobe signal iosastp; and an inverter INV11 for inverting a signal outputted through the non-inverting output terminal X.

The transfer inverter 720 includes: a PMOS transistor MP15 which is connected between an internal voltage terminal vt1 and an output terminal thereof and has a gate receiving a signal outputted through the inverting output terminal Y; and an NMOS transistor MN16 which is connected between the ground voltage terminal VSSTL and the output terminal and has a gate receiving an output of the inverter INV11.

The latch 730 is configured with two inverters INV12 and INV13, which are connected to the output terminal of the transfer inverter 720.

Meanwhile, the read data driving block 750 includes: an NMOS transistor which is connected to the ground voltage terminal VSSTL and has a gate receiving a read data driving pulse rdp; and an NMOS transistor MN17 which is connected between the NMOS transistor MN18 and the global data bus DQ and a gate receiving the output of the latch 730.

Figure 8:
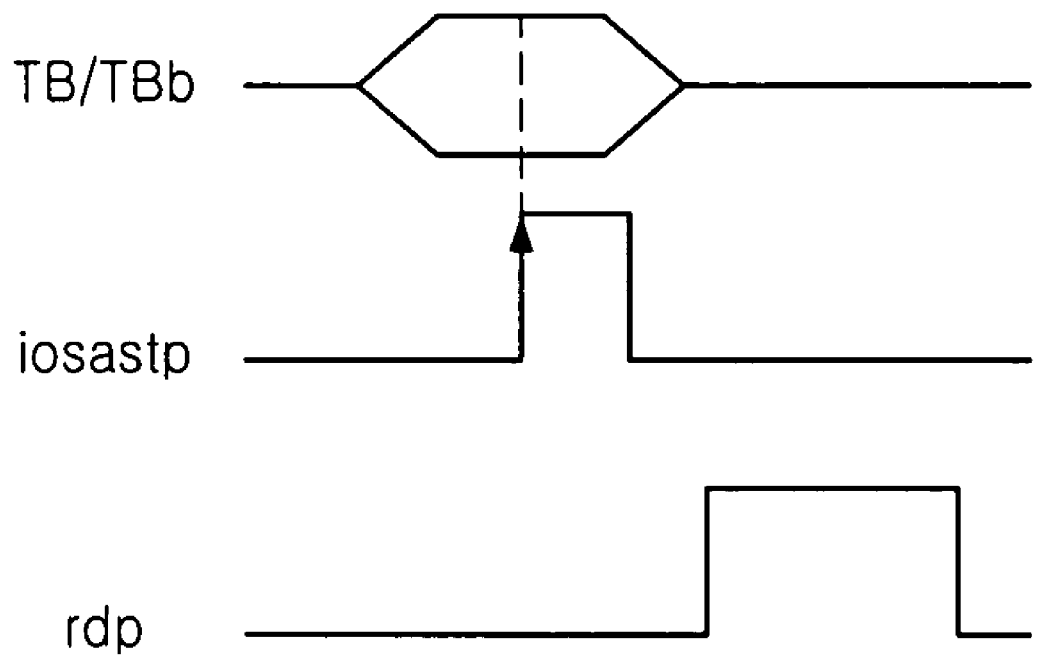
FIG. 8 is a timing diagram of the circuit shown in FIG. 7.

FIG. 8 is a timing diagram of the circuit shown in FIG. 7. An operation of the bus connection circuit for the read operation of the multi-port DRAM in accordance with the present invention will now be described with reference to FIG. 8.

First, in a state that the read data strobe signal iosastp is inactivated to a logic low level, the non-inverting and inverting output terminals X and Y are precharged to a logic high level by the PMOS transistors MN14 and MN13. Therefore, the logic level latched at the inverter latch 730 is maintained as it is.

Meanwhile, if the read data strobe signal iosastp is activated to a logic high level, the non-inverting and inverting output terminals X and Y have opposite logic levels according to the levels of the signals TB and TBb applied on the transfer buses. The non-inverting and inverting outputs are inverted by the transfer inverter 720 and stored in the latch 730. The stored value is maintained until the signals TB and TBb applied on the transfer buses are changed.

If the value stored in the latch 730 is a logic high level, the NMOS transistor MN17 is turned on. Then, if the read data driving pulse rdp is activated to a logic high level after a predetermined time passes by from a time point when the read command is applied, the NMOS transistor MN18 is turned on so that a current flows through the global data bus DQ.

Figure 1:
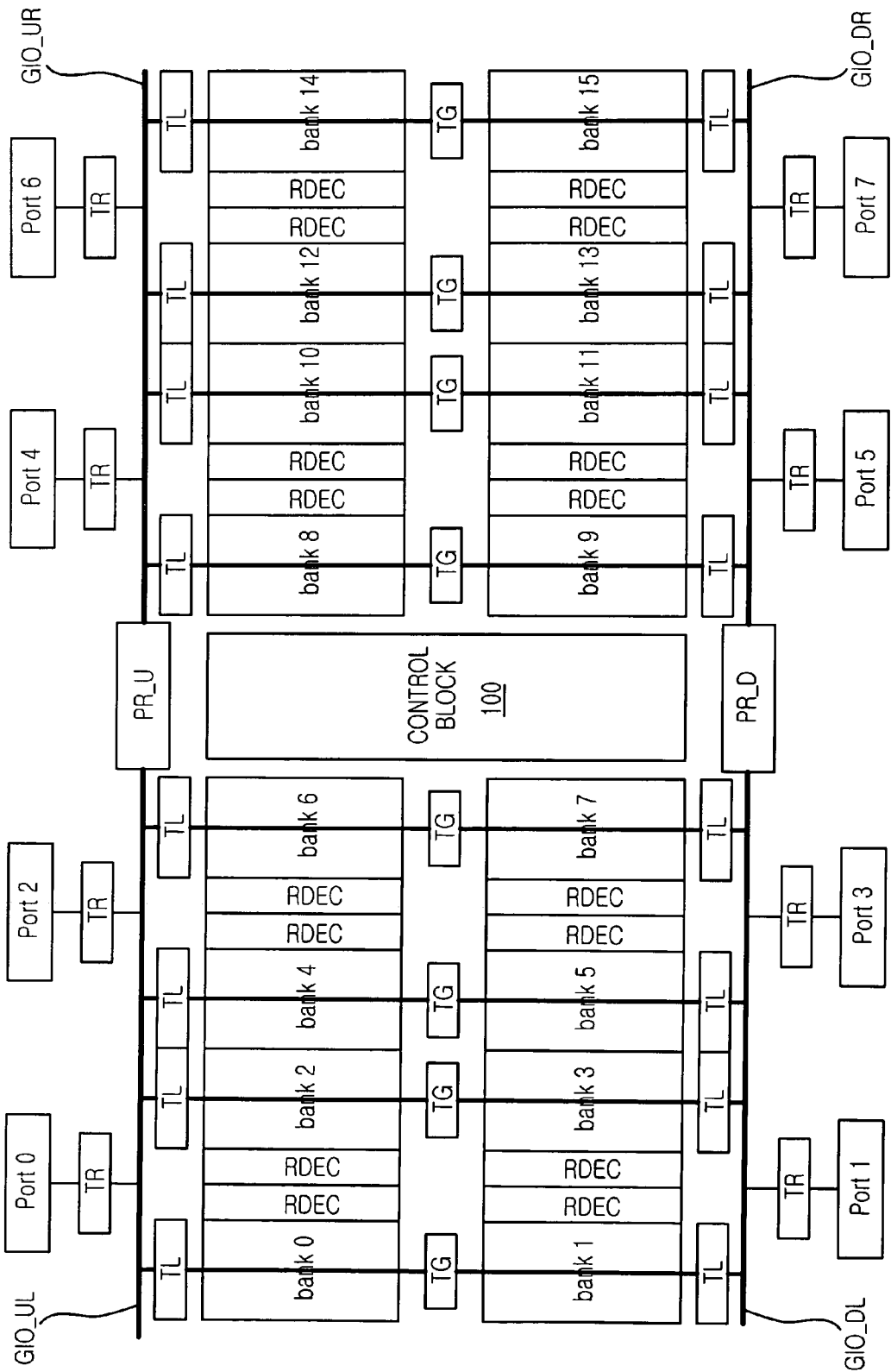
FIG. 1 illustrates an architecture of a 256M multi-port DRAM, which is disclosed in Korean Patent Application No. 2003-92375.
Figure 3A:
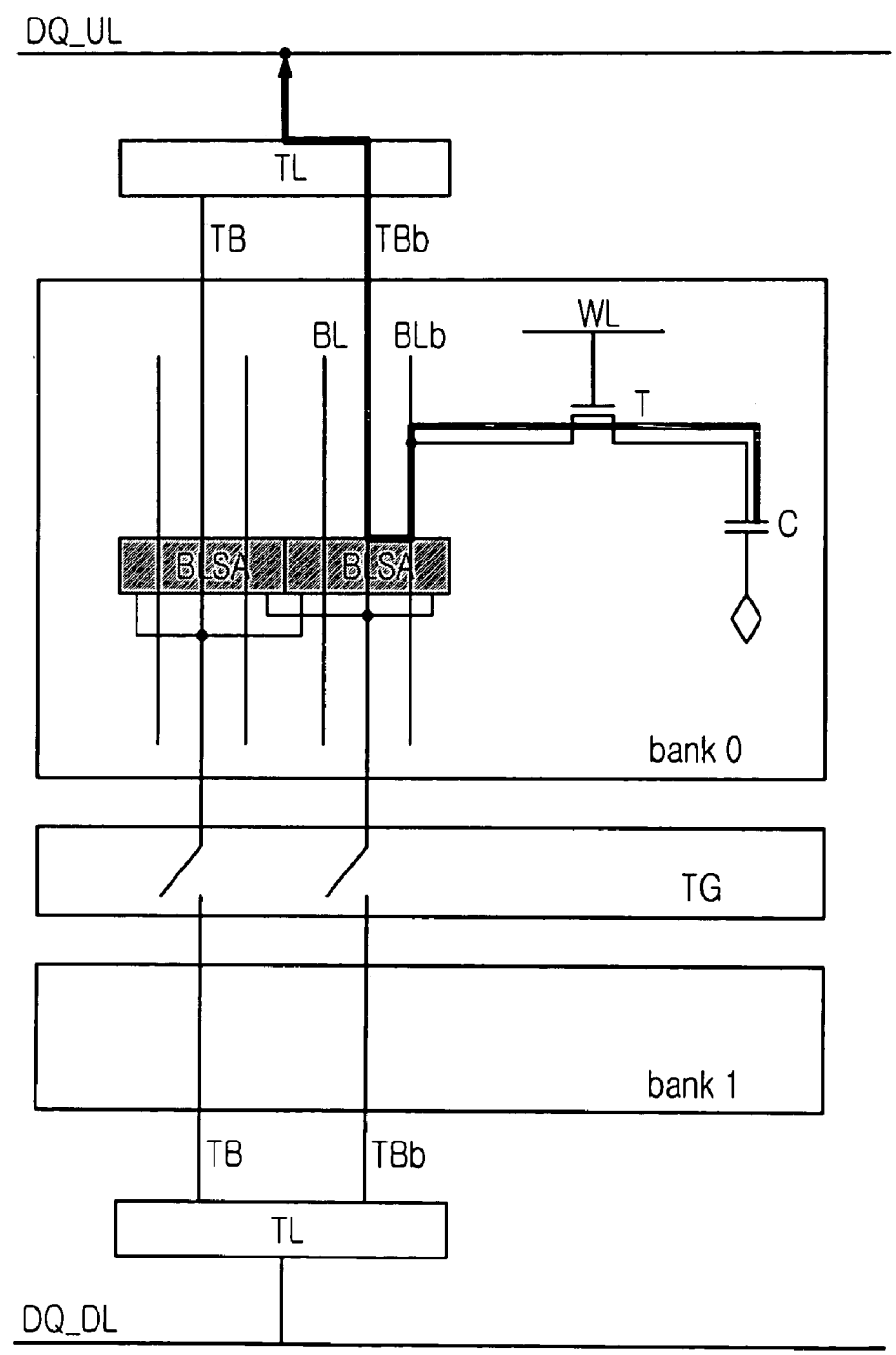
FIG. 3A illustrates a normal read path of the 256M multi-port DRAM depicted in FIG. 2.
Figure 3B:
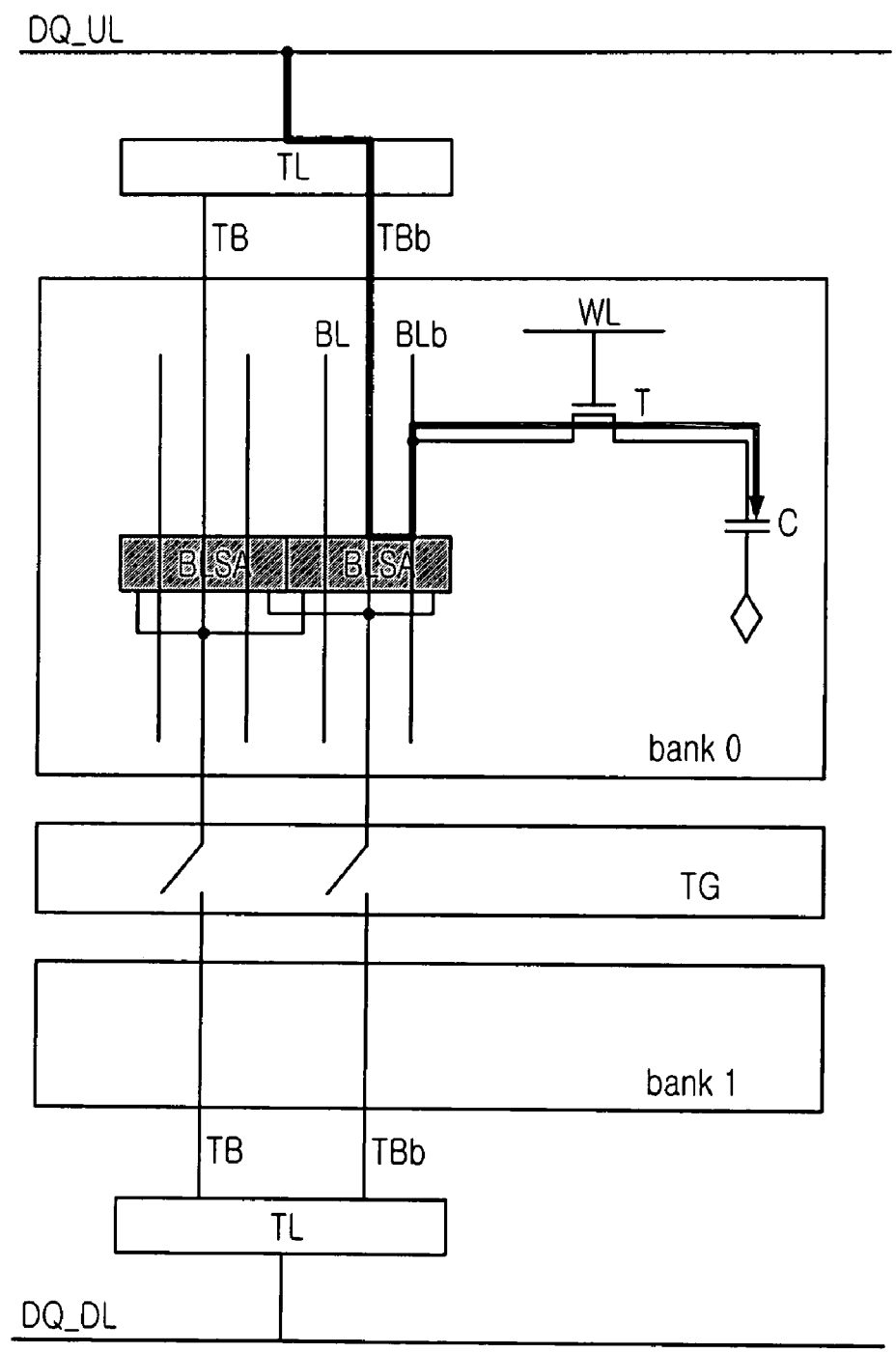
FIG. 3B illustrates a normal write path of the 256M multi-port DRAM depicted in FIG. 2.
Figure 4A:
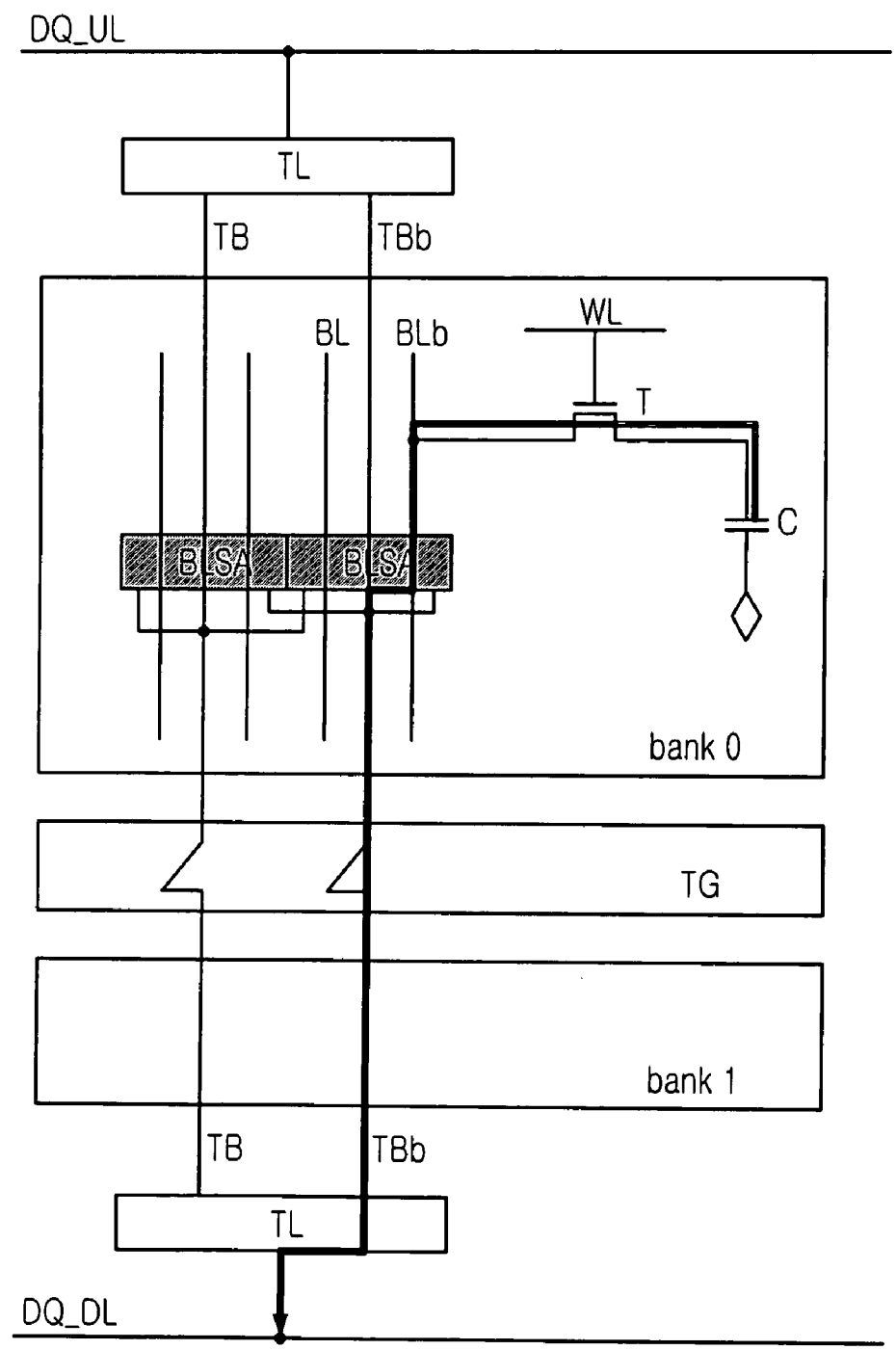
FIG. 4A illustrates a cross read path of the 256M multi-port DRAM depicted in FIG. 2.
Figure 4B:
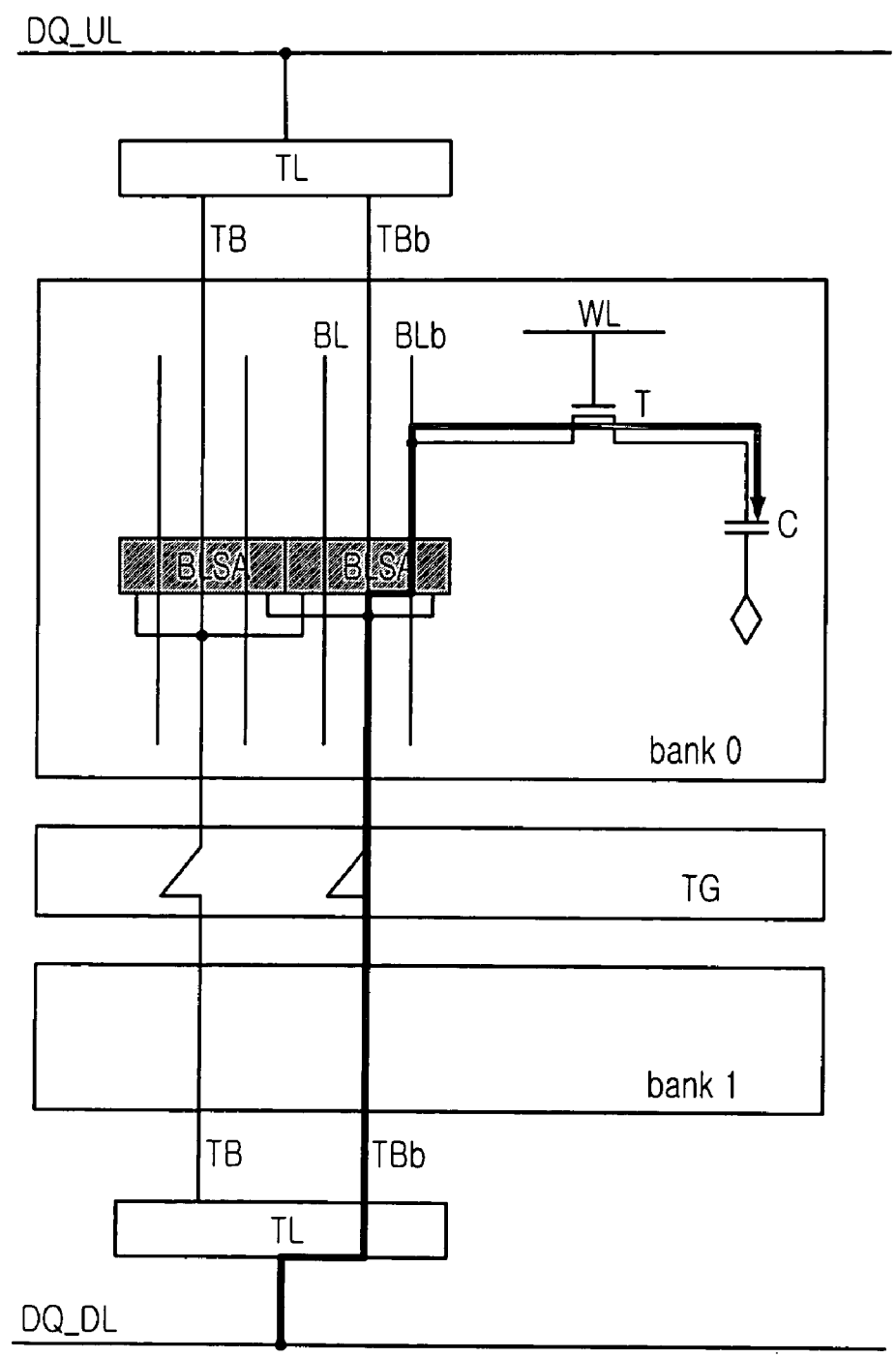
FIG. 4B illustrates a cross write path of the 256M multi-port DRAM depicted in FIG. 2.
Figure 2:
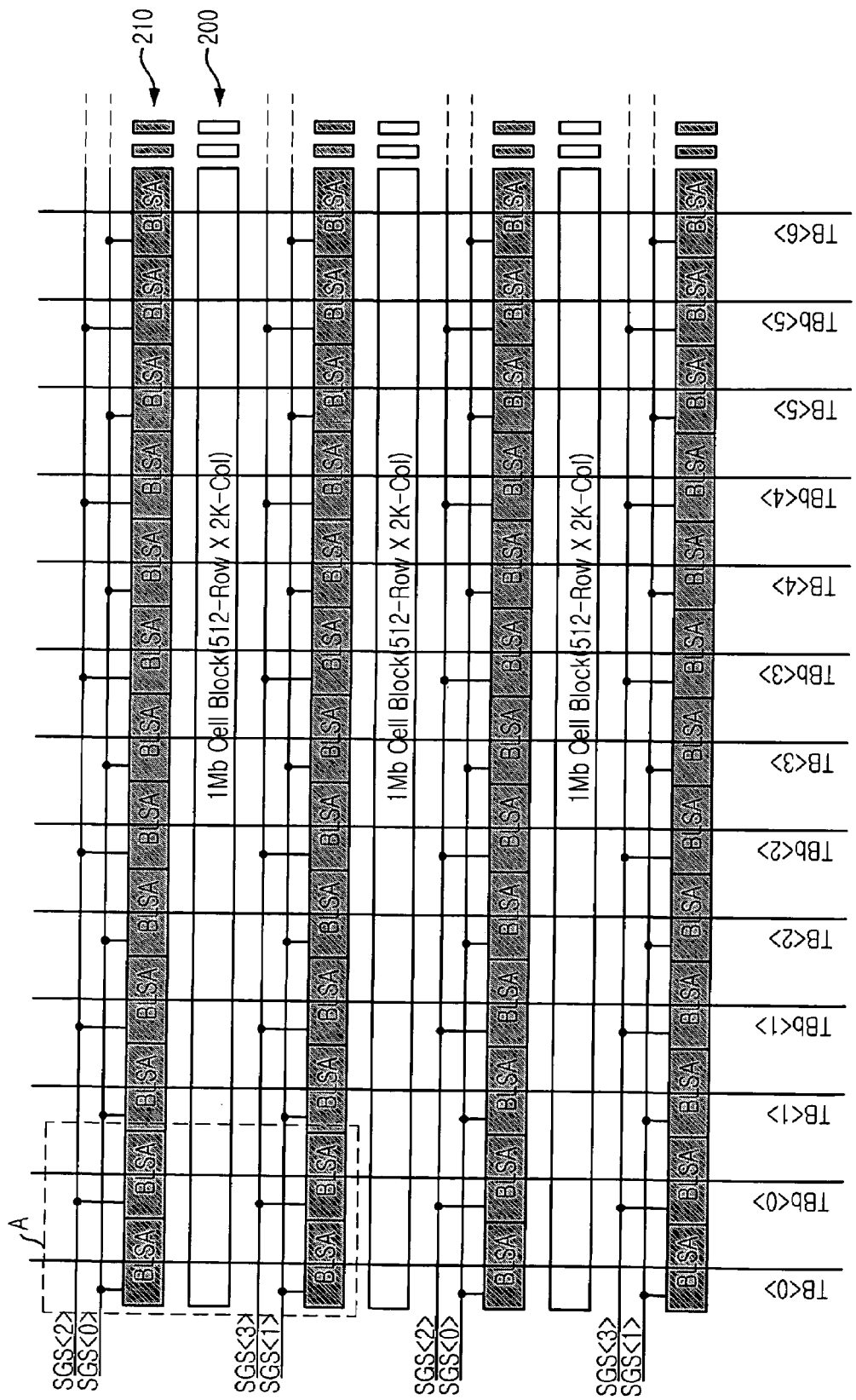
FIG. 2 is a block diagram illustrating a segment and a transfer bus TB in the 256M multi-port DRAM of FIG. 1.
Figure 5:
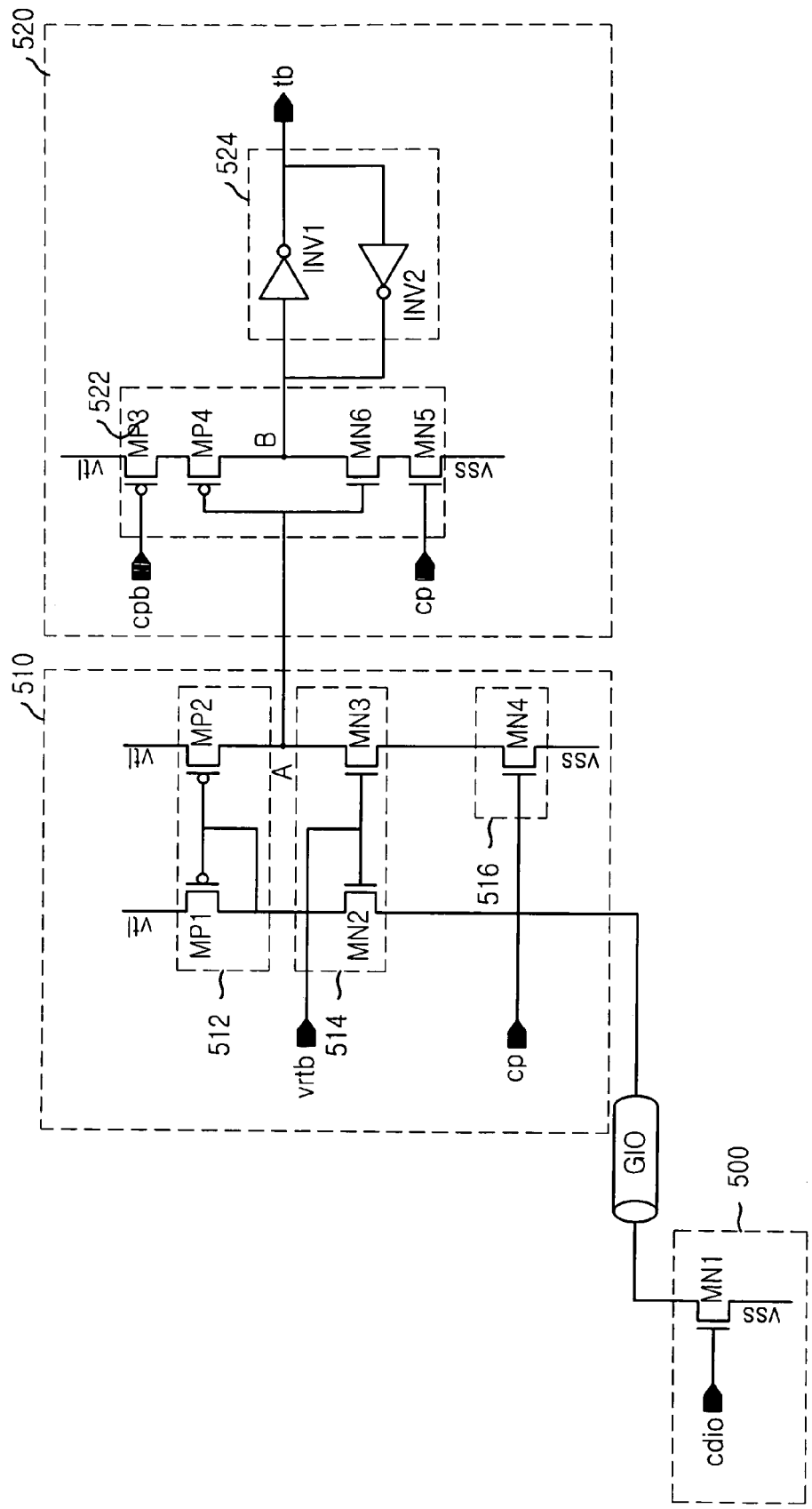
FIG. 5 illustrates a circuit configuration of a transmitter and a receiver, which is disclosed in Korean Patent Application No. 2003-94697.
Figure 6:
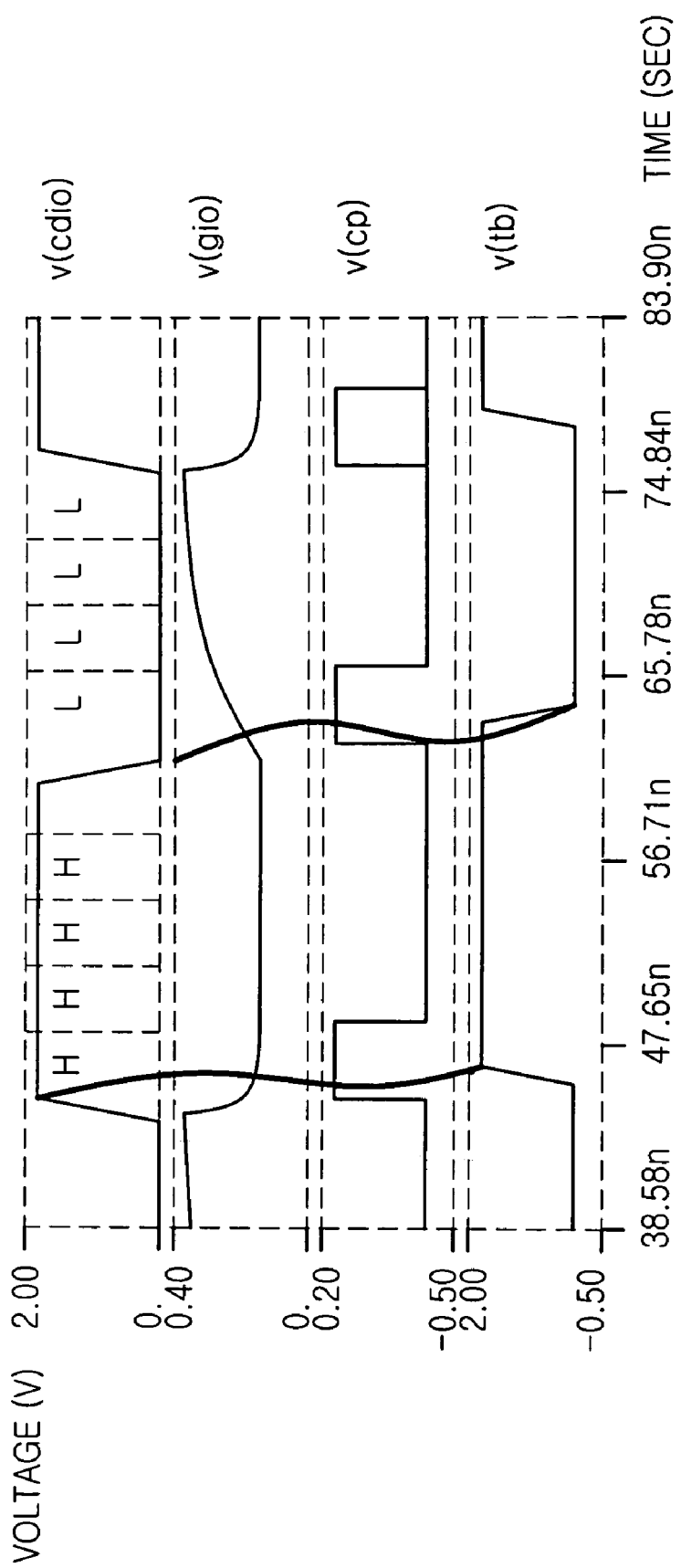
FIG. 6 illustrates a simulation result of the circuit shown in FIG. 5.

Meanwhile, if the value stored in the latch 730 is a logic low level, the NMOS transistor MN17 is turned off. Therefore, even if the read data driving pulse rdp is activated to a logic high level, a current does not flow through the global data bus DQ any more. Such an operational principle has been fully described with reference to FIGS. 5 and 6.

As a result, the bus connection circuit in accordance with the present invention strobes and latches the data applied on the transfer buses TB and TBb at a rising edge of the read data strobe signal iosastp and transfers the latched data to the global data bus DQ when the read data driving pulse rdp is activated.

Although a case of using the DRAM cell is described as one embodiment, the present invention can be applied to cases of using other RAM cells, including SRAM.

Also, although a case of using 512-bit unit segment is described as one embodiment, the present invention can be applied to a case when the number of bits of the unit segment is changed.

Further, the number of ports and the number of banks can be varied depending on a capacity of memory device.

Furthermore, although a case of employing NMOS-type differential-input flip-flop using a sink NMOS transistor is described as one embodiment, the present invention can be applied to a case of employing PMOS-type differential-input flip-flop using a source PMOS transistor.

According to the present invention, the bus connection circuit for the read operation of the multi-port memory device is adapted to the current sensing type bus transmission/reception structure. Thus, it is possible to reduce a current consumption of the multi-port memory device using a wide global data bus.

The present application contains subject matter related to Korean patent applications No. 2004-31988, filed in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A bus connection circuit for a read operation of a multi-port memory device, comprising:
a read data sensing/latching means for sensing/latching a read data applied on a local data bus in response to a read data strobe signal; and
a read data driving means for driving a latched data in the read data sensing/latching means to a global data bus in response to a read data driving pulse, and for connecting or disconnecting a path of current flowing to the global data bus according to a logic level of the latched data,
wherein the read data sensing/latching means includes:
a differential-input flip-flop for sensing/latching the read data applied on the local data bus in response to the read data strobe signal;
a transfer inverter configured to receive differential output signals of the differential-input flip-flop; and
an inverter latch for latching an output of the transfer inverter.

2. The bus connection circuit as recited in claim 1, wherein the read data driving means includes:
a first NMOS transistor which is connected to a ground voltage terminal and has a gate receiving the read data driving pulse; and
a second NMOS transistor which is connected between the first NMOS transistor and the global data bus and has a gate receiving an output of the read data sensing/latching means.

3. The bus connection circuit as recited in claim 1, wherein the differential-input flip-flop includes:
a first MOS transistor which is connected to a ground voltage terminal and has a gate receiving the read data strobe signal;
second and third MOS transistors which are connected to one terminal of the first MOS transistor and have gates receiving signals applied on respective transfer buses; and
fourth to seventh MOS transistors which are cross-coupled to a non-inverting/inverting output terminals, thereby configuring an inverter latch.

4. The bus connection circuit as recited in claim 3, wherein the differential-input flip-flop further includes eighth to ninth MOS transistors for precharging the non-inverting/inverting output terminals during an inactivation section of the read data strobe signal.

5. The bus connection circuit as recited in claim 3, wherein the differential-input flip-flop further includes a first inverter for inverting signals outputted through the non-inverting/inverting output terminals.

6. The bus connection circuit as recited in claim 5, wherein the transfer inverter includes:
a PMOS transistor which is connected between an internal voltage terminal and an output terminal of the transfer inverter and has a gate receiving the signal outputted through the inverting output terminal; and
an NMOS transistor which is connected between the ground voltage terminal and the output terminal of the transfer inverter and has a gate receiving an output of the first inverter.

7. The bus connection circuit as recited in claim 6, wherein the inverter latch includes two inverters which are connected to the output terminal of the transfer inverter.

8. A bus connection circuit for a read operation of a multi-port memory device, comprising:
a read data sensing/latching means for sensing/latching a read data applied on a local data bus pair in response to a read data strobe signal by using a level difference between data loaded on data buses of the local data bus pair; and
a read data driving means for driving a latched data in the read data sensing/latching means to a global data bus in response to a read data driving pulse, and for connecting or disconnecting a path of current flowing to the global data bus according to a logic level of the latched data.

9. The bus connection circuit as recited in claim 8, wherein the read data sensing/latching means includes:
- a differential-input flip-flop for sensing/latching the read data applied on the local data bus pair in response to the read data strobe signal;
- a transfer inverter configured to receive differential output signals of the differential-input flip-flop; and
- an inverter latch for latching an output of the transfer inverter.

10. The bus connection circuit as recited in claim 8, wherein the read data driving means includes:
- a first NMOS transistor which is connected to a ground voltage terminal and has a gate receiving the read data driving pulse; and
- a second NMOS transistor which is connected between the first NMOS transistor and the global data bus and has a gate receiving an output of the read data sensing/latching means.

11. The bus connection circuit as recited in claim 9, wherein the differential-input flip-flop includes:
- a first MOS transistor which is connected to a ground voltage terminal and has a gate receiving the read data strobe signal;
- second and third MOS transistors which are connected to one terminal of the first MOS transistor and have gates receiving signals applied on respective transfer buses; and
- fourth to seventh MOS transistors which are cross-coupled to a non-inverting/inverting output terminals, thereby configuring an inverter latch.

12. The bus connection circuit as recited in claim 11, wherein the differential-input flip-flop further includes eighth to ninth MOS transistors for precharging the non-inverting inverting/inverting output terminals during an inactivation section of the read data strobe signal.

13. The bus connection circuit as recited in claim 11, wherein the differential-input flip-flop further includes a first inverter for inverting signals outputted through the non-inverting/inverting output terminals.

14. The bus connection circuit as recited in claim 13, wherein the transfer inverter includes:
- a PMOS transistor which is connected between an internal voltage terminal and an output terminal of the transfer inverter and has a gate receiving the signal outputted through the inverting output terminal; and
- an NMOS transistor which is connected between the ground voltage terminal and the output terminal of the transfer inverter and has a gate receiving an output of the first inverter.

15. The bus connection circuit as recited in claim 14, wherein the inverter latch includes two inverters which are connected to the output terminal of the transfer inverter.

* * * * *